(12) United States Patent
Nishikawa

(10) Patent No.: US 6,705,709 B2
(45) Date of Patent: Mar. 16, 2004

(54) PIEZOELECTRIC THIN FILM DEVICE, A MASTER DISC FOR MANUFACTURING THEREFOR, AN INK-JET RECORDING HEAD, AND MANUFACTURING METHOD THEREFOR

(75) Inventor: Takao Nishikawa, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/184,376

(22) Filed: Jun. 25, 2002

(65) Prior Publication Data

US 2002/0189099 A1 Dec. 19, 2002

Related U.S. Application Data

(62) Division of application No. 09/335,300, filed on Jun. 17, 1999.

(30) Foreign Application Priority Data

Jun. 18, 1998 (JP) .......................................... 10-171887

(51) Int. Cl.$^7$ ................................................ B41J 2/045
(52) U.S. Cl. .............................. 347/71; 347/68; 347/72
(58) Field of Search ............................. 347/71, 68, 70, 347/72; 29/890.1, 25.35

(56) References Cited

U.S. PATENT DOCUMENTS 6,019,458 A * 2/2000 Shimada et al. .............. 347/70

* cited by examiner

*Primary Examiner*—Thinh Nguyen
(74) *Attorney, Agent, or Firm*—Harness, Dickey & Pierce, P.L.C.

(57) ABSTRACT

An object of the present invention is to provide a method for manufacturing ink jet recording heads by simple and inexpensive means. In order to realize this object, the present invention forms thin film piezoelectric elements using the so-called transfer method, and joining these to a pressure chamber plate. First, a forming plate 8 is prepared beforehand, provided with concavities 82 corresponding to the shapes of thin film piezoelectric elements 5, and upper electrodes 4 and a piezoelectric film 3 are formed as films inside the concavities 82. Then either a lower electrode or a vibration plate 2 is formed so as to cover the piezoelectric film 3, and the thin film piezoelectric elements 5 are fabricated. A substrate 1 constituting a pressure chamber plate is joined to the thin film piezoelectric elements 5, and the thin film piezoelectric elements 5 are removed from the forming plate 8. The substrate 1 is etched to form pressure chambers 11, and a nozzle plate 6 is joined thereto, whereupon the ink jet recording head is manufactured.

14 Claims, 15 Drawing Sheets

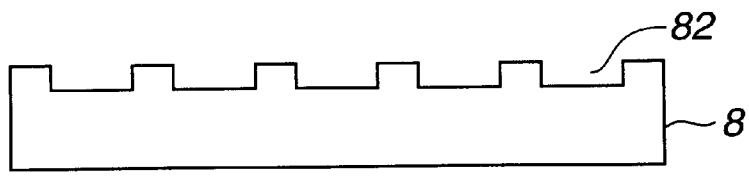
FIG.1(a)
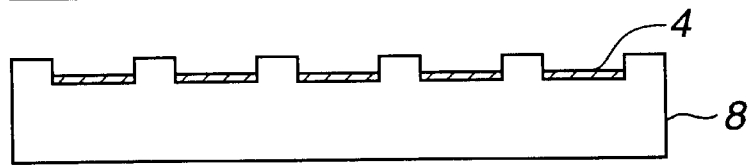
FIG.1(b)
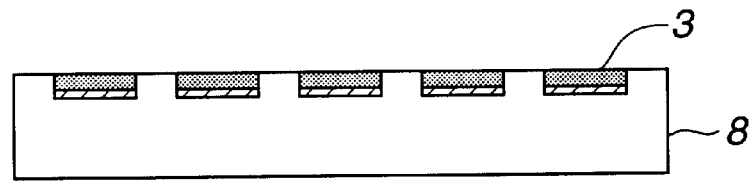
FIG.1(c)
FIG.1(d)
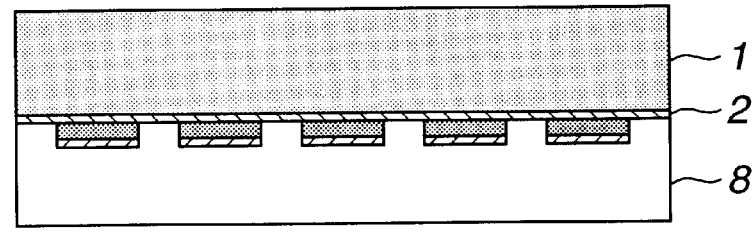
FIG.1(e)
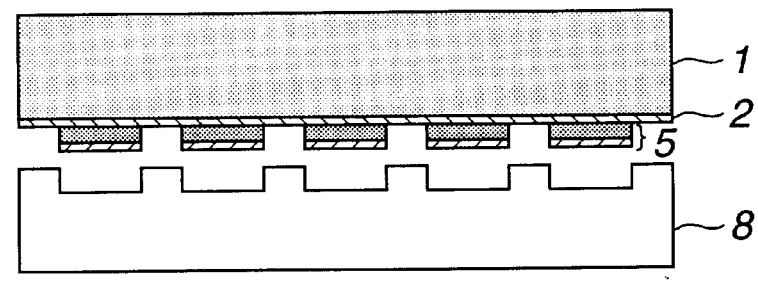
FIG.1(f)
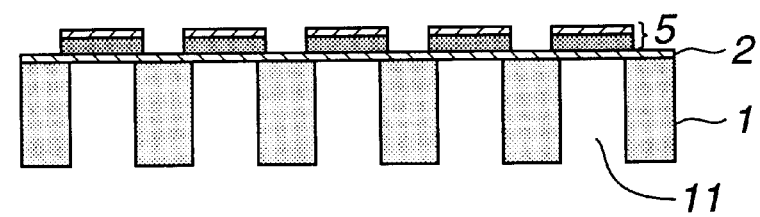
FIG.1(g)
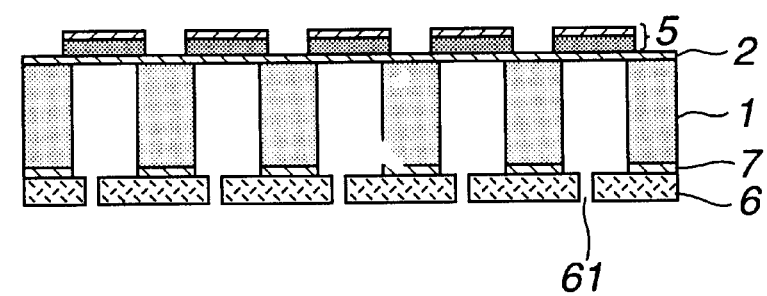

ated (hereinafter "PZT") as the main component, or a three-component system to which a third component is added to the PZT of the two-component system. In the configuration of the ink jet recording head, the output terminals of a drive circuit (not shown) are connected to the upper electrode of each thin film piezoelectric element 5, and the ground terminal of the drive circuit is connected to the lower electrode.

PIEZOELECTRIC THIN FILM DEVICE, A MASTER DISC FOR MANUFACTURING THEREFOR, AN INK-JET RECORDING HEAD, AND MANUFACTURING METHOD THEREFOR

BACKGROUND OF THE INVENTION

1. Field of the Invention

This invention relates to a manufacturing method for a piezoelectric, on-demand ink jet recording head wherein thin film piezoelectric elements are used as drive sources for ink ejection, and particularly to an ink jet recording head manufacturing method wherewith lithographic steps are eliminated from the thin film piezoelectric element manufacturing step.

2. Description of the Related Art

One type of ink jet recording head is the piezoelectric, on-demand type wherein a thin film piezoelectric element that functions as an electromechanical conversion element is used as the drive source for ink ejection. Such an ink jet recording head is configured so that ink is stored in a pressure chamber formed in a pressure chamber substrate, changes are imparted to the internal capacity of the pressure chamber via a vibration plate by the mechanical displacement of the thin film piezoelectric element, and ink droplets are jetted from a nozzle hole.

In FIG. 16 is given a diagonal view of the main parts of an ink jet recording head. Part of this diagonal view is rendered as a cross-section to make it easier to understand. As diagrammed in this figure, the ink jet recording head comprises main parts configured such that a vibration plate 2 and thin film piezoelectric elements 5 are provided on one side, while a pressure chamber substrate 1 having pressure chambers 11 formed integrally therein and a nozzle plate 6 whereon are arranged nozzle holes 61 are joined on the other side. In the pressure chamber plate 1, multiple pressure chambers 11 for jetting ink are provided in a strip-like connected row arrangement with separating side walls 12 by etching a monocrystalline silicon substrate or the like. Each pressure chamber 11 connects to a common flow path 14 via an ink supply port 13. In the nozzle plate 6 are formed nozzle holes 61, for jetting the ink, in correspondence with the pressure chambers 11.

The vibration plate 2 has a two-layer structure comprising a lower electrode and an insulating film. In the structure diagrammed in FIG. 16, the lower electrode functions as the lower electrode for the plurality of thin film piezoelectric elements 5, wherefore it is also called the common electrode. Platinum, iridium, and alloys thereof are commonly used for this lower electrode. A silicon dioxide film is commonly used for the insulating film. The thin film piezoelectric elements 5 are formed at positions corresponding to the pressure chambers 11 on the vibration plate 2. An ink tank port 21 is also formed on the vibration plate 2, at a place corresponding to the common flow path 14.

Such a thin film piezoelectric element 5 generally has a structure comprising a piezoelectric film formed from a polycrystalline material, and an upper electrode and lower electrode placed on either side of the piezoelectric film. For the composition of this piezoelectric film is generally used either a two-component system having lead zirconium titanate (hereinafter "PZT") as the main component, or a three-component system to which a third component is added to the PZT of the two-component system. In the configuration of the ink jet recording head, the output terminals of a drive circuit (not shown) are connected to the upper electrode of each thin film piezoelectric element 5, and the ground terminal of the drive circuit is connected to the lower electrode.

In the configuration of this ink jet recording head, if the drive circuit is driven and a prescribed voltage is applied to the thin film piezoelectric element 5, a volumetric change is induced in the thin film piezoelectric element 5, whereupon the ink pressure inside the pressure chamber 11 rises. When this ink pressure rises, ink droplets are jetted from the nozzle hole 61.

Conventionally, lithographic steps have been employed in manufacturing ink jet recording heads. More particularly, it is easy to make elements thereby because the desired pattern can be produced in the thin film piezoelectric elements by a lithographic step. For this reason, lithographic steps have been widely used in the manufacture of ink jet recording heads.

This is now described with reference to FIG. 18. This figure represents a simplified form of a conventional ink jet recording head manufacturing step. The drawings correspond to the A—A cross-section in FIG. 16.

First, as diagrammed in FIG. 18(*a*), a lower electrode is formed at a film on the monocrystalline silicon substrate 1 on the surface whereof is formed a silicon dioxide film by a thermal oxidation method or the like, whereby the vibration plate 2 is formed having a two-layer structure of an insulating film and lower electrode. Following that, the piezoelectric film 3 and upper electrode 4 are formed as films. Then, as diagrammed in FIG. 18(*b*), a resist is applied and a prescribed pattern is exposed and developed to form a resist pattern 91. As diagrammed in FIG. 18(*c*), the upper electrode 4 and piezoelectric film 3 are etched, using the resist pattern 91 as a mask, and the resist pattern 91 is stripped away. In this step the thin film piezoelectric elements 5 are formed. As diagrammed in FIG. 18(*d*), after forming an etching-protection film (not shown) on the thin film piezoelectric elements 5, resist is applied to the side of the substrate 1 on which the thin film piezoelectric elements 5 are formed and on the opposite side thereof, and a prescribed pattern is exposed and developed to form a resist pattern 92. As diagrammed in FIG. 18(*e*), using this resist pattern 92 as a mask, the substrate 1 is subjected to wet anisotropic etching with an aqueous solution of potassium hydroxide, for example, to form the pressure chambers 11. As diagrammed in FIG. 18(*f*), the nozzle plate 6 wherein are formed nozzle holes 61 at positions corresponding to the pressure chambers 11 is bonded by an adhesive 7 to the substrate 1. By the step described above, the ink jet recording head can be fabricated.

With the manufacturing method described above, however, the thin film pressure chambers are formed by lithography, wherefore, while a plurality of thin film pressure chambers can be obtained with one patterning, much material is wasted and costs are increased. Equipment costs are also high, and the equipment requires considerable space. These are problems. With the development in recent years of personal computers, the use of ink jet printers is rapidly proliferating. In view of this situation, cost reduction becomes a necessary and indispensable factor in promoting further proliferation of ink jet printers.

That being so, an object of the present invention is to provide a method wherewith thin film piezoelectric elements and ink jet recording heads can be manufactured inexpensively, in a simple fabrication step, wherein no lithographic step is employed. Another object of the present invention is to provide a forming plate for fabricating thin film piezoelectric elements, and a method of fabricating those forming plates, for use in this manufacturing method. Yet another object of the present invention is to provide an ink jet recording head and an ink jet printer obtained with this manufacturing method.

SUMMARY OF THE INVENTION

The thin film piezoelectric element manufacturing method of the present invention is a method wherein the thin film piezoelectric elements are formed by transfer using a forming plate whereon concavities are formed that match the shape of the thin film piezoelectric element. Using this method, it is possible to form the thin film piezoelectric elements by transfer using the forming plate, wherefore the lithographic steps can be eliminated. The forming plate can be used repeatedly, moreover, wherefore manufacturing costs can be lowered.

More specifically, in the concavities noted above, a first electrode and piezoelectric film are sequentially laminated, a second electrode is formed as a film on the piezoelectric film to form the thin film piezoelectric elements, and then the thin film piezoelectric elements are removed from the concavities. At this time, by forming the thin film piezoelectric elements by transfer using a forming plate wherein the side walls of the concavities have a tapered shape, the thin film piezoelectric elements can readily be removed from the forming plate.

This thin film piezoelectric element transfer-forming technology can be applied to ink jet recording head manufacturing step. An ink jet recording head comprises a configuration wherein are provided, on a pressure chamber plate, thin film piezoelectric elements which function as ejection drive sources for the fluid with which are filled pressure chambers formed in the pressure chamber plate. The ink jet recording head manufacturing method of the present invention forms those thin film piezoelectric elements by transfer in a pressure chamber plate using a forming plate wherein are formed concavities matched to the shape of the thin film piezoelectric elements. Moreover, using the forming plate wherein are formed the concavities matched with the shape of the thin film piezoelectric elements, the pressure chamber plate can also be formed by transfer.

The method of fabricating the forming plate for manufacturing the thin film piezoelectric elements of the present invention is one wherein a resist layer is applied to a forming plate mother material, and this resist layer is formed in a pattern matched to the shape of the thin film piezoelectric elements. The forming plate mother material is then etched, using the resist layer on which the pattern is formed as a mask, and the concavities described above are formed. In this case, it is preferable that the openings of the concavities be formed larger than the bottoms thereof, and that the side walls thereof be formed in a tapered shape. It is also desirable that the forming plate mother material be configured from a material such as silicon or quartz. This is because it is easy to perform the fine detailed steping by applying semiconductor technology.

The thin film piezoelectric elements of the present invention are obtained by the manufacturing method described in the foregoing, and exhibit a side shape that is tapered.

The ink jet recording head of the present invention is an ink jet recording head wherein thin film piezoelectric elements are comprised in a pressure chamber plate for functioning as drive sources for jetting the ink with which the pressure chambers formed in that pressure chamber plate are filled, the side shape of which thin film piezoelectric elements are tapered.

The forming plate for manufacturing the thin film piezoelectric elements of the present invention comprises concavities formed in a pattern matched with the shape of the thin film piezoelectric elements. These concavities are formed with an alignment pitch of 70.5 μm, for example. The concavities, moreover, are arrayed in a plurality of rows with a gap of 141 μm between the rows.

BRIEF DESCRIPTION OF THE DRAWINGS

FIG. 1 is a fabrication step diagram for the ink jet recording head of the present invention;

DESCRIPTION OF THE PREFERRED EMBODIMENTS

First Aspect of the Invention

Figure 2A:
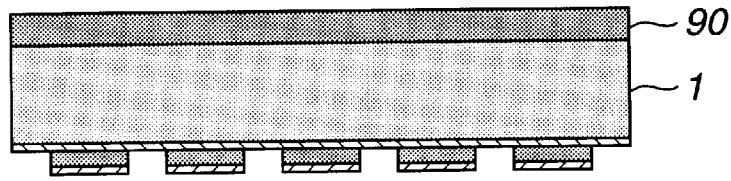
FIG. 2 is a fabrication step diagram for the formation of pressure chambers in a pressure chamber plate.
Figure 2B:
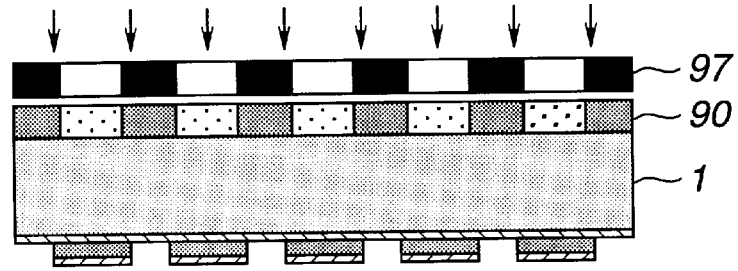
Figure 2C:
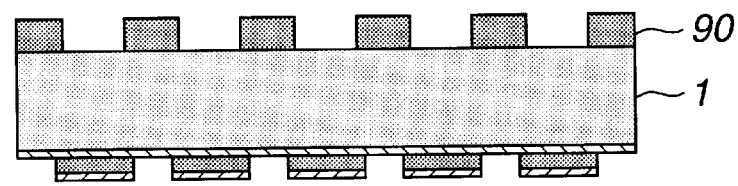
Figure 2D:
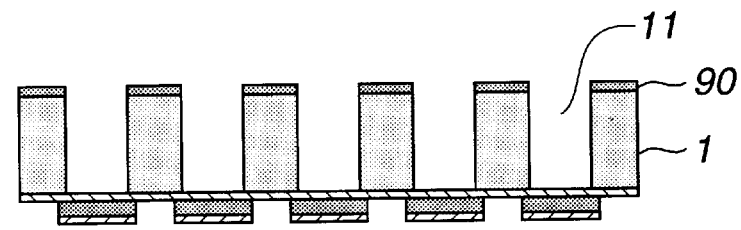
Figure 2E:
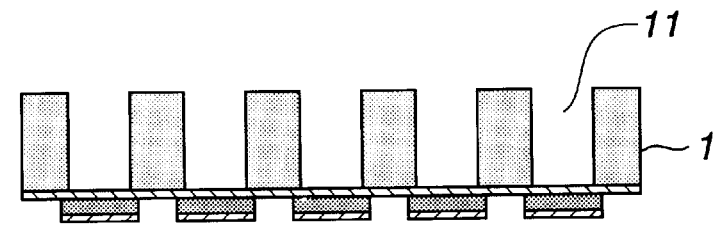

This embodiment aspect relates to technology for forming thin film piezoelectric elements by transfer using a forming plate having a prescribed concave-convex pattern formed therein, joining such to a pressure chamber plate, and thus manufacturing an ink jet recording head.

First, the fabrication step for an ink jet recording head is described with reference to FIG. 1. A forming plate 8 is prepared having a prescribed convex-concave pattern formed therein (FIG. 1(a)). In this forming plate 8, concavities 82 having a depth of 0.6 μm, for example, are formed with a prescribed alignment pitch. The depth of these concavities 82 is determined according to the height of the thin film piezoelectric elements to be formed in the next step. The alignment pitch of the concavities 82 is made the same as the alignment pitch of the pressure chambers formed in a step that will be described subsequently. That pitch is made 70.5 μm (1/360 inch), for example. These concavities 82 are formed in two parallel rows oriented in the primary scanning direction of the ink jet recording head (although, in the drawings, only cross-sections of one row are depicted), with the gap between the rows being, for example, 141 μm (1/180 inch). The alignment pitch for the concavities 82 and the gap between the rows thereof are set so as to be appropriate to the printing precision, and are not limited to the numerical values noted above. A more detailed description of the fabrication step for the forming plate 8 is given below.

Next, the upper electrodes 4 are formed as films on the concavities 82 of the forming plate 8 to serve as the first electrodes (cf. FIG. 1(b)). An electrically conductive material such as platinum or iridium is used for these upper electrodes 4. For the film forming method, a solution wherein fine particles of the electrically conductive material are dispersed in a solvent can be jetted into the concavities 82 by the ink jet recording head, the solvent removed, and the upper electrodes 4 formed. The thickness of the upper electrodes 4 is made 0.2 μm, for example.

Next, the piezoelectric film 3 is formed on the concavities 82 (FIG. 1(c)). This piezoelectric film 3 is formed so as to fill the concavities 82. For the composition of the piezoelectric film 3, a piezoelectric ceramic exhibiting piezoelectric characteristics is used. When a PZT film is adopted for this piezoelectric film, it is preferable to use either a composition wherein the main components are constituted by a two-component system, or one wherein the main components are constituted by a three-component system wherein a third component is added to the two-component system. A specific example of a preferred two-component PZT material is given below.

A material having a composition expressed by the chemical formula $$Pb(Zr_xTi_{1-x})O_3 + YPbO$$

is desirable, where X and Y are such that $$0.40 \leq X \leq 0.60 \text{ and } 0 \leq Y \leq 0.30.$$

As a specific example of a preferable three-component system PZT, a material wherein to the two-component PZT noted above a third component has been added, having a composition expressed by the following chemical formula, may be cited, i.e.

$$PbTi_aZr_b(A_gB_h)_cO_3 + ePbO + (fMgO)_n,$$

where A is a bivalent metal selected from among a group made up of Mg, Co, Zn, Cd, Mn, and Ni, or a trivalent metal selected from among a group made up of Sb, Y, Fe, Sc, Yb, Lu, In, and Cr, where B is a pentavalent metal selected from among a group made up of B, Nb, Ta, and Sb, or a sextavalent metal selected from among a group made up of W and Te, where, moreover,

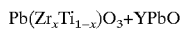
$$a+b+c=1,$$

$$0.35 \leq a \leq 0.55, \ 0.25 \leq b \leq 0.55,$$

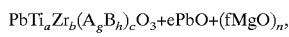
$$0.1 \leq c \leq 0.40, \ 0 \leq e \leq 0.30, \ 0 \leq f \leq 0.15,$$

$$g=f=0.5, \text{ and } n=0,$$

but A is a trivalent metal and B is not a sextavalent metal, or A is a bivalent metal and B is a pentavalent metal, where g is 1/3, where h is 2/3, and where (but only in the case where A is Mg and B is Nb) n is 1.

A more preferable specific example of a three-component system that may be cited is magnesium lead-niobate, that is, where A is Mg, B is Nb, g is 1/3, and h is 2/3.

Furthermore, in order to enhance the piezoelectric characteristics of any of these two-component PZT or three-component PZT materials, minute quantities of Ba, Sr, La, Nd, Nb, Ta, Sb, Bi, W, Mo, or Ca, etc., may be added. It is particularly desirable to improve the piezoelectric characteristics of a three-composition material by adding 0.1 mol % or less of Sr or Ba. with a three-component system, it is desirable to add 0.10 mol % or less of Mn or Ni to improve the sintering characteristics thereof.

Specific examples of compositions which can be used for the piezoelectric film 3 include lead titanate ($PbTiO_3$), lead zirconate titanate ($Pb(Zr,Ti)O_3$), lead zirconate ($PbZrO_3$), lanthanum titanate (($Pb,La)TiO_3$), lanthanum zirconate titanate (($Pb, La)(Zr,Ti)O_3$), and lead magnesium-niobate zirconium-titanate ($Pb(Zr,Ti)(Mg,Nb)O_3$), etc.

These piezoelectric films can be formed by a sputtering method, sol-gel method, MOD method (metal organic decomposition step), laser ablation method, or CVD method, etc. In the example described here, the PZT film is formed for the piezoelectric film 3 using a sol-gel method. When film formation is done using the sol-gel method, a hydroxide hydrate complex having a metal component capable of forming a PZT film, that is, the sol, is introduced into the concavities 82, and subjected to dehydration to produce a gel, which, upon further heating and sintering, yields an inorganic oxide (piezoelectric film). More specifically, a mixture solution of $Pb(CH_3COO)_2 \cdot 3H_2O$, $Zr(t—OCH_4H_9)_4$, and $Ti(i—OC_3H_7)_4$ is prepared for the starting raw material for the PZT film, and the precursor for the PZT piezoelectric film wherein the molar mixture ratios for the lead titanate and lead zirconate are 44% and 56%, respectively, is repeatedly introduced, dried, and degreased a desired number of times (3 times, for example), until the film is formed with a final thickness of 0.4 μm.

For the filling step, the ink jet recording head can be used, for example. For the drying step, natural drying maybe used, or the temperature may be raised to 200° C. or lower. For the degreasing step, heating is employed, to a sufficient temperature and for a sufficient time to gel the sol-composition film and to remove the organic material from the film. In this step, a porous gel thin film is formed from an amorphous metal oxide containing substantially no residual organic material. After forming this piezoelectric film precursor into a film, degreasing is performed three times to crystallize the piezoelectric film precursor, and then the entire substrate is heated. In this step, an infrared radiation light source (not shown) is employed from both sides of the substrate, holding it in an oxygen atmosphere at 650° C. for 5 minutes, whereupon it is heated for 1 minute at 900° C., after which it is allowed to cool down naturally.

In this step, the piezoelectric film is crystallized and sintered with the composition noted earlier, yielding the piezoelectric film 3 having a Perovskite crystalline structure. In this manner, when the film is formed using the sol-gel method, it is possible to form the piezoelectric film 3 so that it fills the concavities 82 by suitably adjusting the amount of PZT piezoelectric film precursor applied.

Next, after forming the piezoelectric film 3 on the concavities 82, the vibration plate 2 is formed as a film (cf. FIG. 1(d)). In this example, the vibration plate 2 is made a two-layer structure comprising an insulating film and the lower electrode which serves as the second electrode. First, the lower electrode is formed as a film. The composition of the lower electrode may be that of an electrically conductive material such as platinum, iridium, iridium oxide, gold, aluminum, or nickel. The film forming method used may be one wherein either a solution wherein fine particles of these electrically conductive materials are dispersed in a solvent, or a solution wherein alcoxide derivatives of these electrically conductive materials are dissolved in a solvent is applied. The application method used may be a common technique such as spin coating, dip coating, roller coating, or bar coating, etc. These films may also be formed by a vacuum deposition method such as sputtering, evaporation coating, or CVD, etc., or by non-electrical electrolytic plating, etc. Lamination may also be performed with a suitable intervening buffer layer of titanium or chromium, etc., in order to enhance the adhesive force between the lower electrode and the insulating film.

After forming the lower electrode film, the insulating film that is a configuring element of the vibration plate 2 is formed. This insulating film may be a silicon dioxide film, zirconium oxide film, tantalum oxide film, silicon nitride film, or aluminum oxide film. It is also permissible to do away with the insulating film itself and have the lower electrode itself double as the vibration plate 2. A thermal oxidation method, ordinary CVD, plasma CVD method, or sputtering, etc., may be used for forming the insulating film. After the vibration plate 2 is formed as a film, the vibration plate 2 is joined to the substrate 1. In this case, the substrate 1 and vibration plate 2 may be bonded together with an intervening adhesive to enhance the adhesive force between the substrate 1 and the vibration plate 2. A monocrystalline silicon substrate having a diameter of 100 mm and thickness of 220 $\mu$m, for example, may be used for this substrate 1.

Next the substrate 1 is removed integrally with the upper electrodes 4, piezoelectric film 3, and vibration plate 2 from the forming plate 8 (cf. FIG. 1(e)). Thus, by this step, is yielded a substrate 1 comprising the thin film piezoelectric elements 5.

Figure 7A:
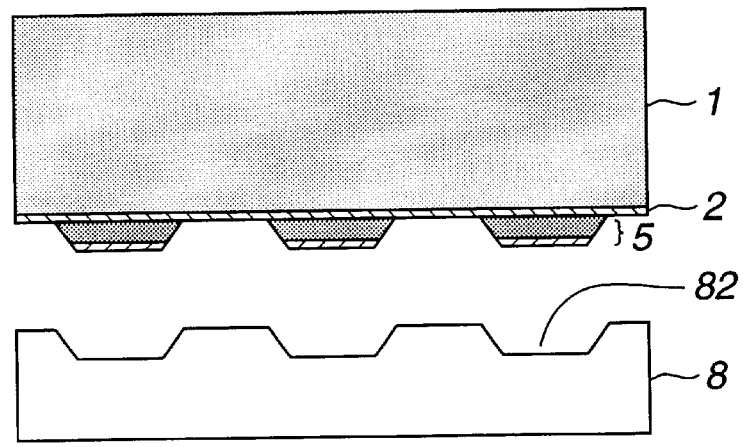
FIG. 7 is an explanatory diagram for the step of removing the thin film piezoelectric elements from the forming plate.
Figure 7B:
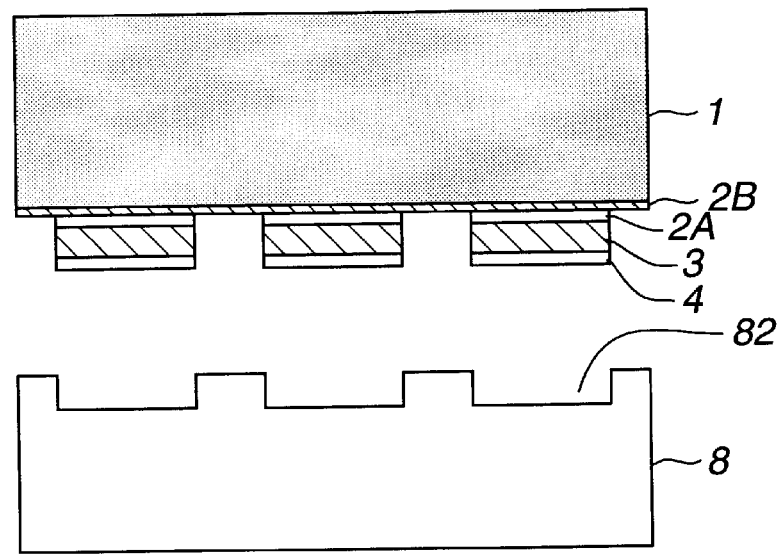

When the friction between the forming plate 8, on the one hand, and the thin film piezoelectric elements 5 and the vibration plate 2, on the other, is large, separation may be difficult. In such cases, as diagrammed in FIG. 7(a), separation can be greatly facilitated by imparting a tapered shape to the concavities 82.

Using the step described in the foregoing, it was possible to fabricate the thin film piezoelectric elements. These thin film piezoelectric elements can be used by themselves. They may of course also be used as drive sources for ink jetting in an ink jet recording head.

Next, an etching protection film (not shown) is formed on the thin film piezoelectric elements 5, and a resist is formed on the opposite side of the substrate 1. By using this resist as a mask and etching the substrate 1, the pressure chambers 11 (cf. FIG. 1(f)) are formed. This step is described in greater detail with reference to FIG. 2.

As diagrammed in FIG. 2(a), a resist layer 90 is formed so as to have a uniform film thickness using a suitable method such as spin coating or spray coating, etc. The resist layer 90 is exposed using a mask 97 wherein is formed the desired pattern matched to the positions where the pressure chambers are to be formed (FIG. 2(b)), and exposure is performed under prescribed conditions (FIG. 2(c)). Using this resist layer 90 as a mask, the substrate 1 is etched to a prescribed depth using an anisotropic etching fluid such as an aqueous solution of potassium hydroxide having a concentration of 10% and maintained at a temperature of 80° C. It is also permissible in this step to use an anisotropic etching method wherein an active gas is employed such as parallel flat-plate ion etching. By this step the pressure chambers 11 are formed (FIG. 2(d)). After forming the pressure chambers 11, the resist 90 is peeled away (FIG. 2(e)).

To the substrate 1 formed by the step described in the foregoing is joined a separate nozzle plate 6 with an intervening layer of adhesive 7 (FIG. 1(g)). This adhesive 7 may be an epoxy adhesive, urethane adhesive, or silicone adhesive, etc. Nozzle holes 61 are formed in this nozzle plate 6 so as to correspond with the pressure chambers 11.

Figure 6A:
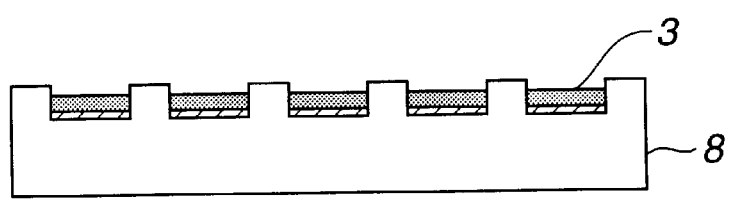
FIG. 6 is a diagram of another example structure for the thin film piezoelectric elements.
Figure 6B:
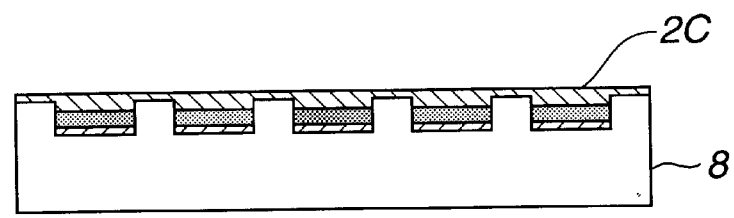

When using the forming plate 8 to form the thin film piezoelectric elements, instead of forming the piezoelectric film 3 so as to fill the concavities 82 in the forming plate 8, as diagrammed in FIG. 1(c), it may be formed to a thickness of only part of the depth of the concavities 82, as diagrammed in FIG. 6. The step for forming the piezoelectric film 3 is diagrammed in FIG. 6(a), and the step of forming the common electrode 2C is diagrammed in FIG. 6(b).

As diagrammed in (b), moreover, it is also permissible to sequentially form the upper electrodes 4, piezoelectric film 3, and lower electrode 2A as films in the concavities 82, and to form the insulating film 2B so as to cover the thin film piezoelectric elements.

Next, the step of fabricating the forming plate for manufacturing the thin film piezoelectric elements is described with reference to FIGS. 3–5.

The fabrication step for the forming plate for manufacturing the thin film piezoelectric elements (first fabrication step) is described with reference to FIG. 3. A resist layer 93 is formed on the forming plate mother material 81, as diagrammed in FIG. 3(a). A silicon wafer can be used for this forming plate mother material 81. The technology for etching silicon wafers is well established as a part of semiconductor manufacturing technology, wherewith high-precision etching control is possible.

However, so long as it is an etchable material, this is not limited to a silicon wafer, and may instead be glass, quartz, metal, resin, or ceramic, etc. As to the substance used for forming the resist layer 93, this may be a commercially sold positive resist wherein a diazo naphtoquinone derivative is mixed as a photosensitive agent into cresol black, for example, such as is commonly used in the manufacture of semiconductor devices.

The method used in forming the resist layer 93 may be selected, as appropriate, from any method including spin coating, dip coating, spray coating, roller coating, and bar coating, etc.

Figure 3A:
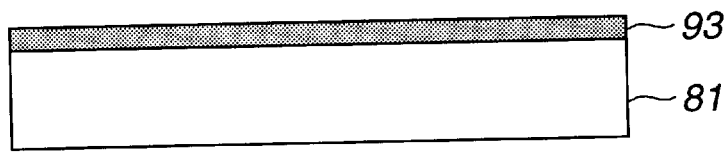
FIG. 3 is a fabrication step diagram for a forming plate for manufacturing thin film piezoelectric elements.
Figure 3B:
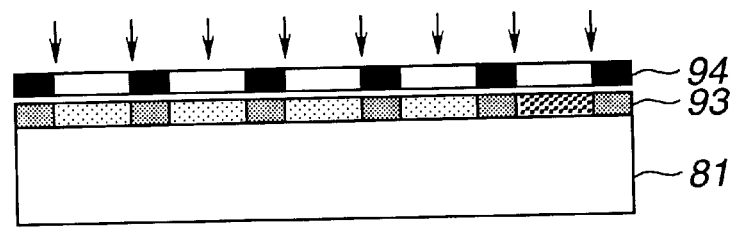
Figure 3C:
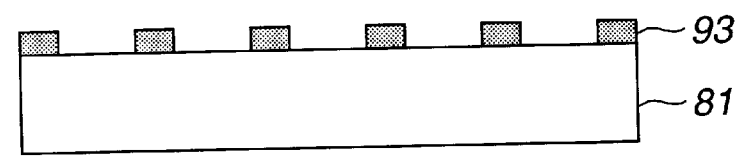
Figure 3D:
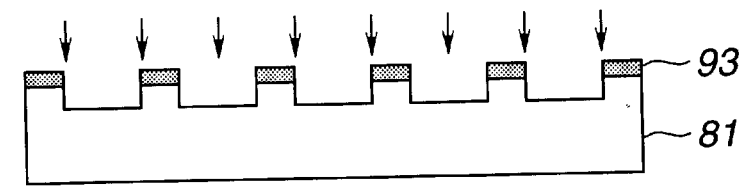
Figure 3E:
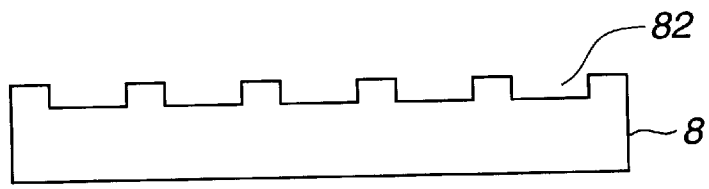

Next, as diagrammed in FIG. 3(b), the resist layer 93 is exposed through a patterned mask 94 matched with the positions where the thin film piezoelectric elements are to be formed. As diagrammed in FIG. 3(c), the photo-exposed areas are selectively removed by developing the resist layer 93 under prescribed conditions, whereupon the surface of the forming plate mother material 81 is exposed. Using this resist layer 93 as a mask, the forming plate mother material 81 is etched to a prescribed depth (FIG. 3(d)). The etching method used may be either a wet or a dry method, suitably selected according to what is demanded by the characteristics of the forming plate mother material 81 material, the etching cross-sectional shape, and the etching rate, etc. From the perspective of controllability, the dry method is superior, wherewith the concavities 81 can be etched in the desired shape, making them rectangular, or imparting a taper thereto, by altering such step conditions as the type of etching gas used, gas flow pressure, gas pressure, and bias voltage, etc. In particular, the inductive coupling step (ICP), electro-cyclotron resonance (ECR) method, and high-density plasma etching techniques such as the helicon wave exciting method are ideal for deep-etching the forming plate mother material 81.

Next, as diagrammed in FIG. 3(*e*), the resist layer 93 is removed, and a forming plate 8 is obtained having a convex-concave pattern corresponding to the shape of the thin film piezoelectric elements.

In the description given in the foregoing, a positive resist is employed as the etching mask for the forming plate mother material 81, but a negative resist may be used. In that case, a mask is used having the reverse pattern of that of the mask 94. Alternatively, instead of using a mask, a direct resist may be pattern-exposed using a laser beam or electron beam, etc.

Next, the fabrication step for the forming plate for manufacturing the thin film piezoelectric elements (second fabrication step) is described with reference to FIG. 4 and FIG. 5.

Figure 4A:
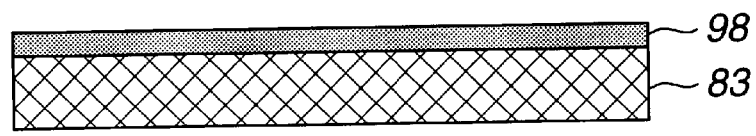
FIG. 4 is a fabrication step diagram for a forming plate for manufacturing thin film piezoelectric elements.
Figure 4B:
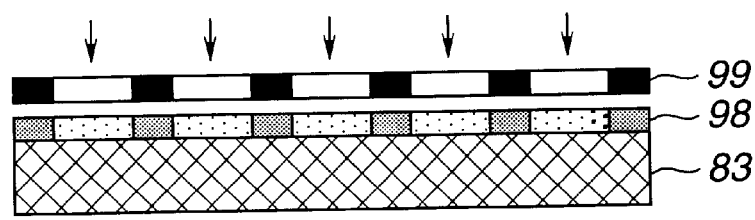
Figure 4C:
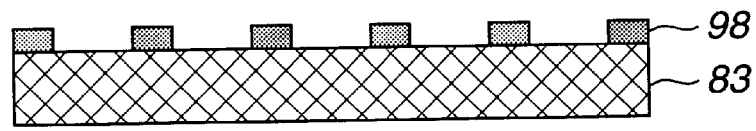

A resist layer 98 is formed on a forming plate 83, as diagrammed in FIG. 4(*a*). The forming plate 83 serves as a support body for the resist layer 98 during the step flow, and so is not particularly limited so long as it exhibits sufficient mechanical strength and chemical resistance, etc., to stand up in the step flow, as well as good wetting and bonding properties relative to the material forming the resist layer 98.

Substrates such as glass, quartz, silicon wafers, resins, metals, and ceramics can be used. What is used here is a glass forming plate the surface whereof has been polished flat with a cerium-based polishing agent, and which has been washed and dried. The material used to form the resist layer 98, and the film-forming methods, etc., are the same as in the first fabrication method described earlier. The resist layer 98 is exposed through a mask 99, as diagrammed in FIG. 4(*b*). This mask 99 has been formed as a pattern so that light may penetrate to prescribed areas. When the resist layer 98 is developed, the exposed areas are removed and the resist layer 98 is patterned as diagrammed in FIG. 4(*c*). A conductibility-imparting layer 84 is formed on the resist layer 98 and the surface-exposed forming plate 83 to make the surface thereof conductible (FIG. 5(*d*)). For this conductibility-imparting layer 84, nickel, for example, may be formed to a thickness of from 500 Å to 1000 Å, using a sputtering method, CVD, evaporation, or non-electrolytic plating as the method of forming it. As diagrammed in FIG. 5(*e*), using the resist layer 98 and forming plate 83 made conductible by the conductibility-imparting layer 84 as the cathode and either chip-shaped or ball-shaped nickel as the anode, a metal layer 85 is formed by depositing nickel by electroplating. The composition of the electroplating liquid is as follows.

| | |
|---|---|
| Nickel sulfamate: | 500 g/l |
| Boric acid: | 30 g/l |
| Nickel chloride: | 5 g/l |
| Leveling agent: | 15 mg/l |

Figure 5D:
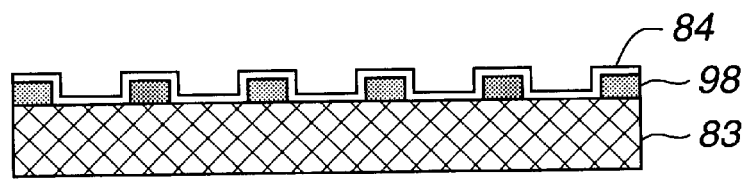
FIG. 5 is a fabrication step diagram for a forming plate for manufacturing thin film piezoelectric elements.
Figure 5E:
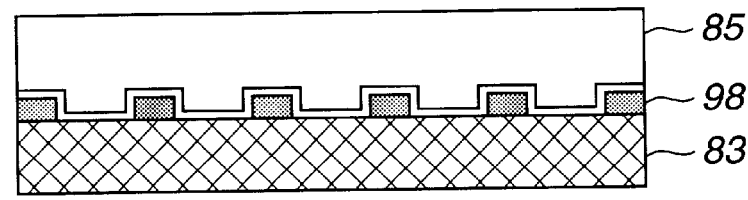
Figure 5F:
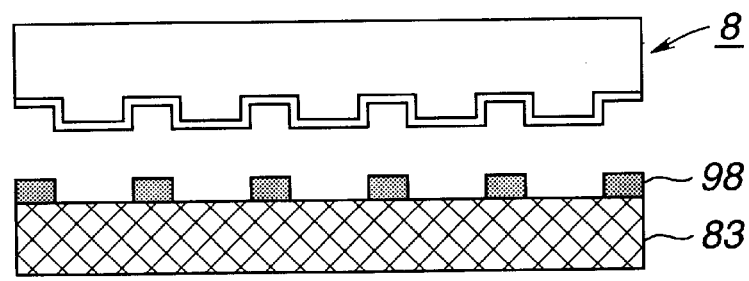

As diagrammed in FIG. 5(*f*), the conductibility-imparting layer 84 and metal layer 85 are removed from the forming plate 83 to render, after washing, the forming plate 8.

When necessary, moreover, the conductibility-imparting layer 84 may be removed from the metal layer 85 by a stripping step. The forming plate 83 can be reused after restoring and cleaning it so long as its durability allows.

Based on this embodiment aspect, as described in the foregoing, thin film piezoelectric elements can be transfer-formed using a forming plate whereon has been formed the prescribed convex-concave pattern, wherefore it is possible to reduce ink jet recording head manufacturing costs. That is, once a forming plate has been fabricated, it can be used again and again so long as the durability thereof permits. Thus the cost of fabricating the forming plate can be eliminated in the manufacture of ink jet recording heads from the second use of the forming plate on.

It is also possible to reduce the amount of space required for the manufacturing equipment by using fewer lithographic steps. The cost of materials needed in lithographic steps can also be reduced.

Figure 17:
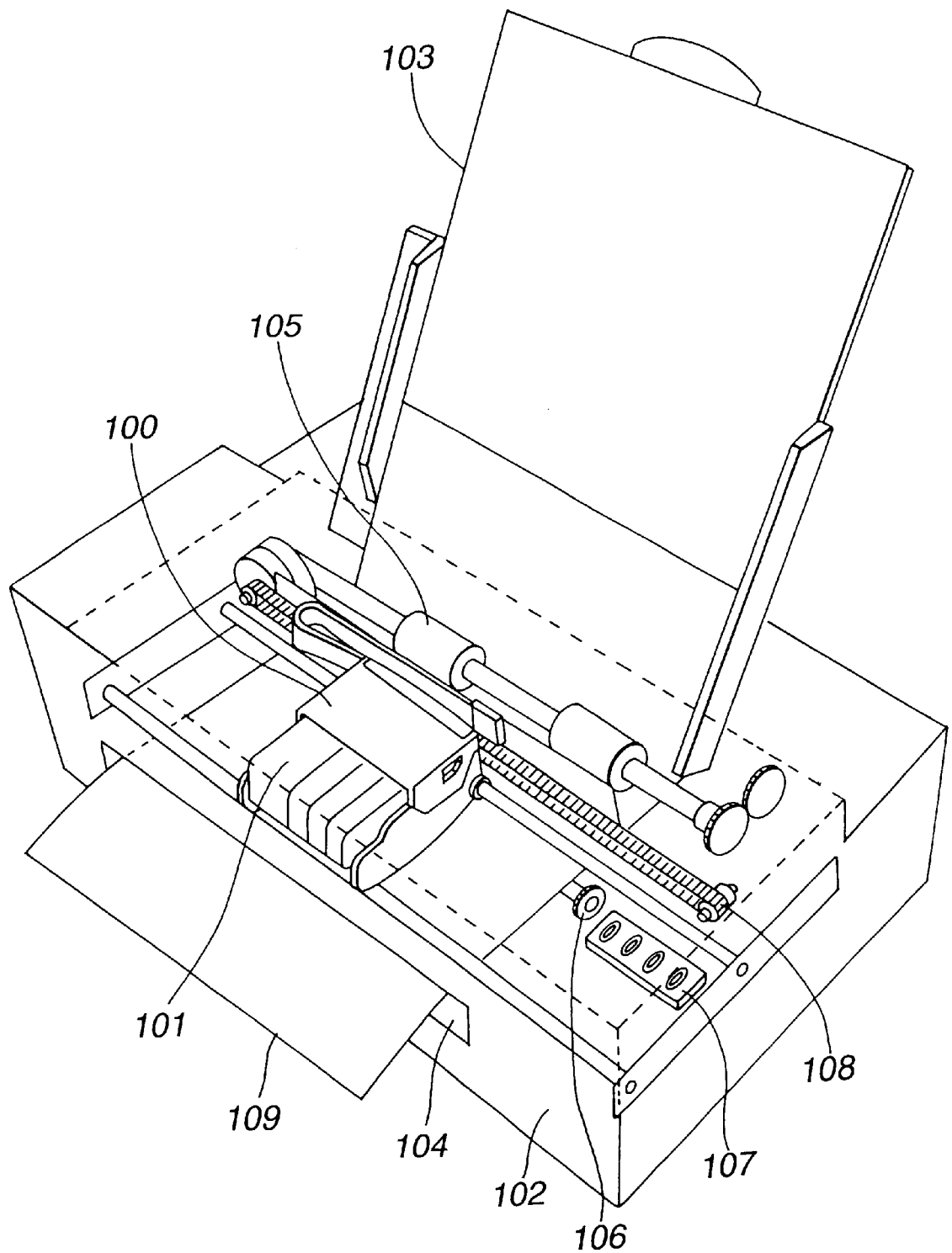
FIG. 17 is a structural diagram of an ink jet printer.
Figure 18A:
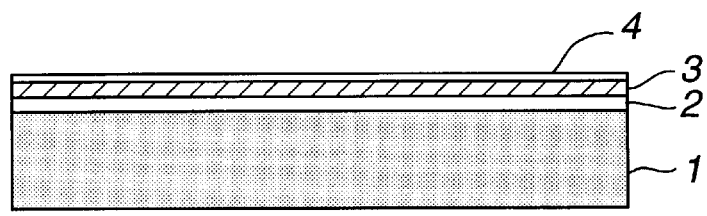
FIG. 18 is a fabrication step diagram for a conventional ink jet recording head.
Figure 18B:
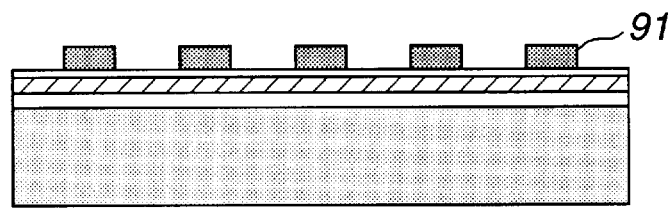
Figure 18C:
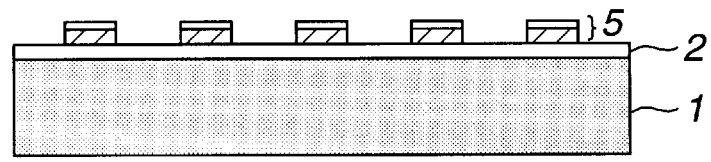
Figure 18D:
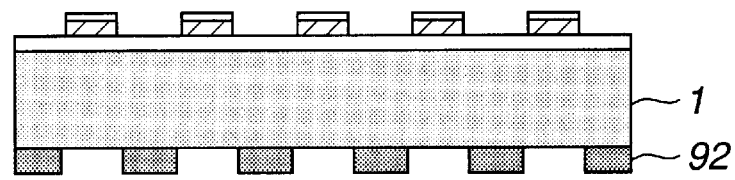
Figure 18E:
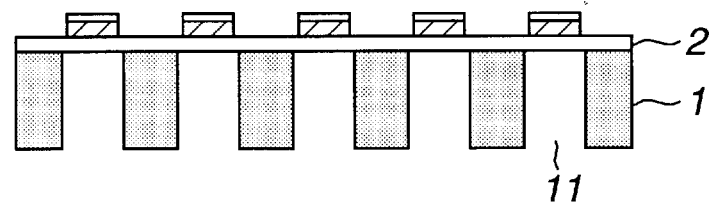
Figure 18F:
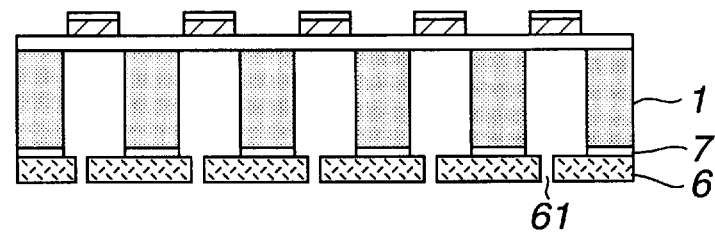

In FIG. 17 is given a configuration diagram for an ink jet printer equipped with an ink jet recording head produced with the manufacturing method described in the foregoing. This ink jet printer comprises the main components of an ink jet recording head 100, main cabinet 102, tray 103, and head drive mechanism 106. The ink jet recording head 100 is equipped with ink cartridges in a total of four colors, namely yellow, magenta, cyan, and black, and is thus configured for full-color printing. The ink jet printer also comprises a dedicated internal controller which controls the ink ejection timing of the ink jet recording head 100 and the scanning of the head drive mechanism 106 so that high-precision ink dot control and half-tone steping, etc., can be implemented. The main cabinet 102 comprises a tray 103 on its back side, and an internal auto sheet feeder 105, so that the recording paper 107 is automatically fed in and then ejected from a discharge slot 104 on the front side. The main cabinet 102 also comprises a cap 107 and a cleaner 106 to prevent ink blockage in the ink jet recording head 100. When printing is not being done, the ink jet recording head 100 is moved to this position and capped by the cap 107. In order to prevent both ink drying and ink blockage during printing, the ink jet recording head 100 moves to one side of the main cabinet 102 and ink is wiped off with the cleaner 106. For the recording paper 107, it is possible to use ordinary paper, special paper, recommended OHP sheet paper, glossy paper, glossy film, level sheets, and government-produced postcards, etc.

Second Aspect of the Invention

This embodiment aspect relates to technology for manufacturing an ink jet recording head by transfer-forming thin film piezoelectric elements and a pressure chamber plate with a forming plate whereon is formed a prescribed convex-concave pattern, and joining the thin film piezoelectric elements and the pressure chamber plate.

The manufacturing steps of the ink jet recording head are described first. The thin film piezoelectric elements 5 and the vibration plate 2 are formed by the steps described in the first embodiment aspect, that is, by the steps diagrammed in FIGS. 1(*a*) to 1(*c*).

Figure 8:
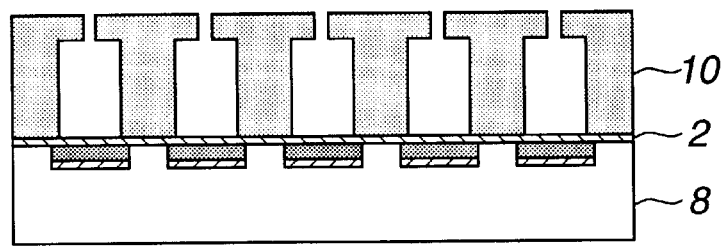
FIG. 8 is a fabrication step diagram for the ink jet recording head of the present invention.
Figure 9A:
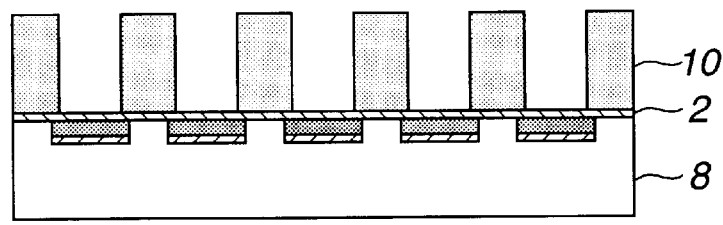
FIG. 9 is a fabrication step diagram for the ink jet recording head of the present invention.
Figure 9B:
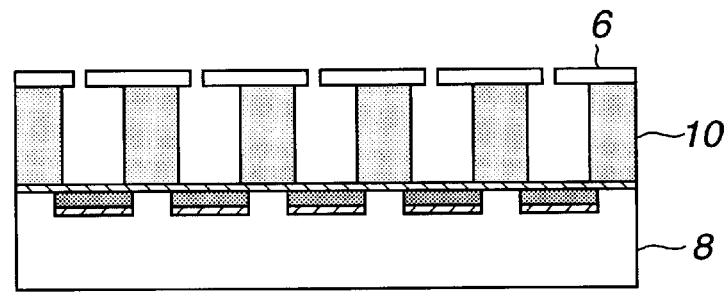

After forming the thin film piezoelectric elements 5 and the vibration plate 2, as diagrammed in FIG. 8, a pressure chamber plate 10 comprising pressure chambers pre-formed with a forming plate having a prescribed pattern is joined to the vibration plate 2. (The fabrication step in which the pressure chamber plate 10 is transfer-formed is described subsequently.) Also, instead of the pressure chamber plate 10 wherein the nozzles are formed integrally, as diagrammed in FIG. 8, the configuration may be such that a nozzle plate is joined separately, as diagrammed in FIG. 9. In that case, a nozzle plate 6 is joined to the pressure chamber plate 10 (FIG. 9(*b*)) after the pressure chamber plate 10 is joined (FIG. 9(*a*)).

Next, the pressure chamber plate fabrication step is described with reference to FIG. 10. First, the forming plate 20 which has concavities 21 formed therein matching the shape of the pressure chambers is prepared (FIG. 10(a)). The fabrication method for this forming plate 20 is the same as that described in embodiment aspect 1, and so is not further described here.

Figure 10A:
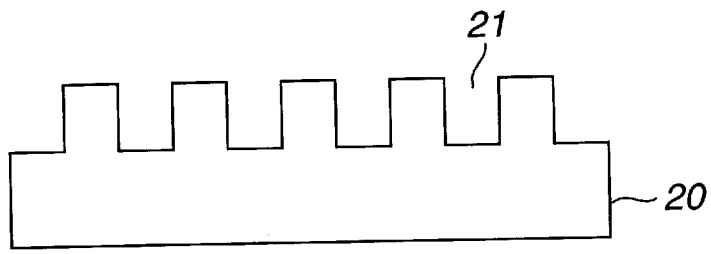
FIG. 10 is a fabrication step diagram for a pressure chamber plate.
Figure 10B:
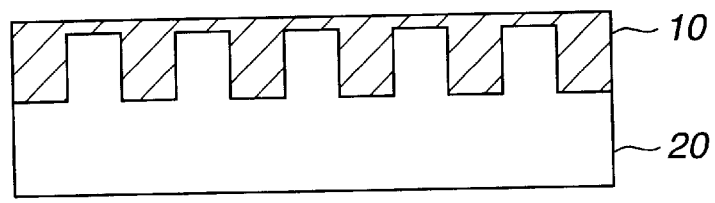

Then, pressure chamber plate forming material 10 is applied to the forming plate 20, and this is hardened (FIG. 10(b)). This pressure chamber plate forming material 10 is not particularly limited so long as it exhibits satisfactory mechanical strength and anticorrosive properties as required in the pressure chamber plate, and can withstand the step conditions. Thus various substances can be used, although one that can be hardened by the application of energy is to be preferred. By employing such a substance as this, it can be handled as a low-viscosity liquid substance when coating it on the forming plate. Thus the concavities in the forming plate can readily be filled with the pressure chamber plate forming material 10 all the way to their finer regions, whereupon the convex-concave pattern on the forming plate can be transferred with fine precision.

It is preferable that the energy imparted to the pressure chamber plate forming material 10 be either light or heat energy, or both light and heat energy. Using such energy as this, a general-purpose manufacturing apparatus such as a photo-exposure apparatus, sintering oven, or hot plate can be used, making it possible to reduce manufacturing costs, and to avoid the manufacturing space over-density associated with the introduction of new manufacturing equipment.

For the pressure chamber plate forming material 10 can be used either a silicon-based polymer precursor such as a polysilane, polycarbosilane, polysiloxane, or polysilazane, or an organic polymer precursor such as a polyimide resin, acrylic resin, epoxy resin, melamine resin, or novolac resin.

As necessary in order to make the application possible or easier, the substances noted above may be dissolved in a solvent and used in that state. The solvent used for this purpose may be, for example, propylene glycol monomethylethyl acetate, propylene glycol monopropyl ether, methoxymethyl propionate, ethoxyethyl propionate, ethyl cellosolve, ethyl cellosolve acetate, ethyl lactate, ethyl pyruvinate, methyl amyl ketone, cyclohexanone, xylene, toluene, or butyl acetate, etc., either singly or as a mixed solution containing a plurality of such types.

After applying the pressure chamber plate forming material 10, a curing step suitable to that material is performed and the material is hardened.

For the pressure chamber plate forming material 10, furthermore, in addition to the materials listed above, it is also possible to use a thermoplastic material such as a hydrate glass, for example. By hydrate glass here is meant glass that is a solid at room temperature, that has a water content of from several percent to several tens of percent, and that exhibits plasticity at high temperatures. If, after forming this hydrate glass on the forming plate 20, a dehydration step is performed thereon, a pressure chamber plate is obtained which excels in mechanical strength, anticorrosive properties, and heat resistance.

Figure 10C:
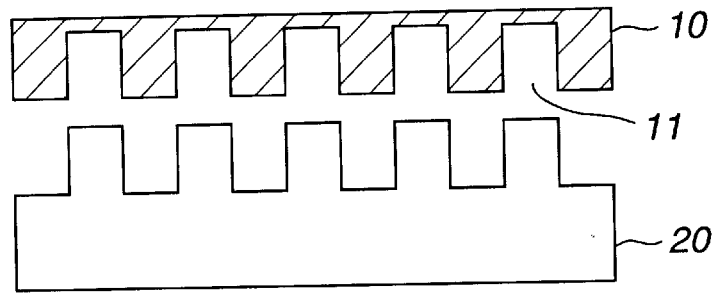
Figure 12:
FIG. 12 is a diagram of another example structure for a forming plate for manufacturing thin film piezoelectric elements.

Next, the pressure chamber plate 10 is removed from the forming plate 20 (FIG. 10(c)). As to the separating method used, the forming plate 20 may be secured, for example, and the pressure chamber plate 10 held by suction and mechanically removed. In that case, if the shapes of the concavities 21 in the convex-concave pattern formed on the forming plate 20 are tapered so that their openings are wider than their bottoms, as diagrammed in FIG. 12, the friction between the pressure chamber plate 10 and forming plate 20 when they are being separated can be reduced, and thus separation of the pressure chamber plate 10 can be readily achieved.

Figure 10D:
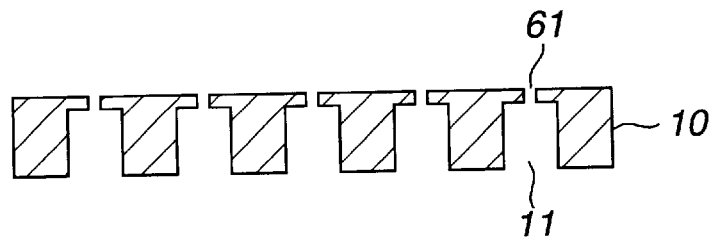
Figure 11A:
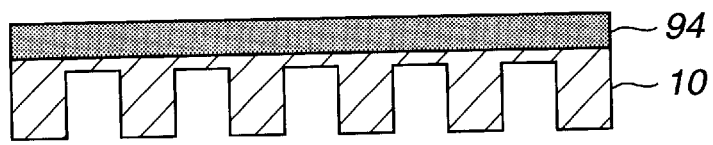
FIG. 11 is a fabrication step diagram for a pressure chamber plate.
Figure 11B:
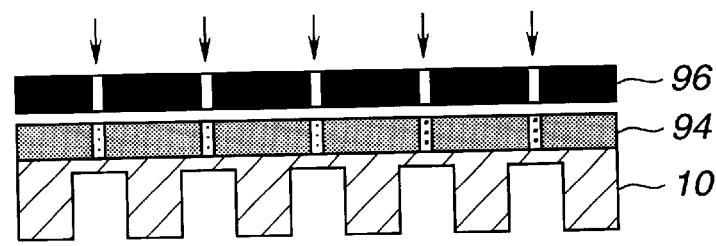
Figure 11C:
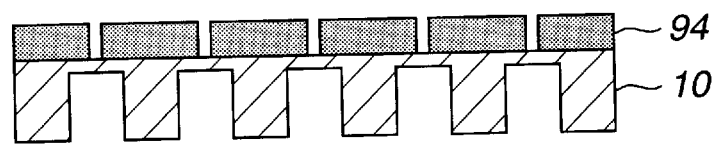
Figure 11D:
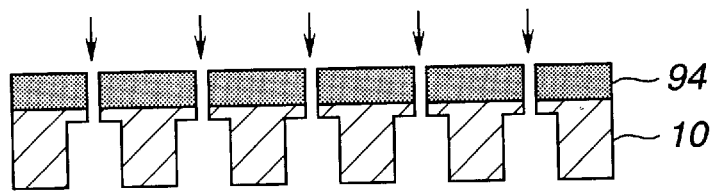
Figure 11E:
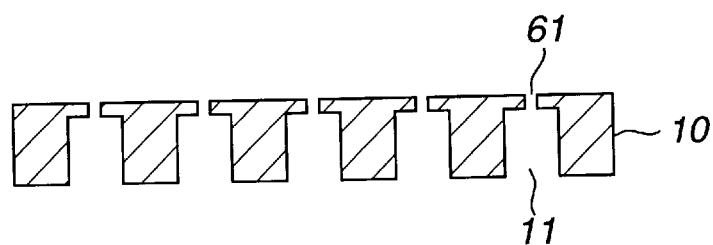

Next, nozzles 61 are formed at positions corresponding to the pressure chambers 11 in the pressure chamber plate 10 (FIG. 10(d)). For forming these nozzles 61, a lithographic method, laser step, FIB step, or electrical discharge step, etc., can be used.

The details of the step of forming the nozzles 61 are described now with reference to FIG. 11. The resist layer 94 is spin-coated on the pressure chamber plate 10, as diagrammed in FIG. 11(a). The composition of and film-forming method for this resist layer 94 are the same as described earlier. Next, photo-exposure is performed through the mask 96 at the positions where the nozzles are to be formed, as diagrammed in FIG. 11(b). The exposed areas are developed and removed, thereby exposing the pressure chamber plate 10 to the surface (FIG. 11(c)). Using this resist layer 94 as a mask, the pressure chamber plate 10 is etched all the way through (FIG. 11(d)). The same etching methods as were used in the first embodiment aspect may be used here. After the etching is finished, the resist layer 94 is removed to yield the pressure chamber plate 10 with the nozzles 61 formed therein (FIG. 11(e)).

When removing the pressure chamber plate 10 from the forming plate, in addition to the technique described earlier, any of the other methods (first, second, and third removal method, respectively) described below may be used.

Figure 13:
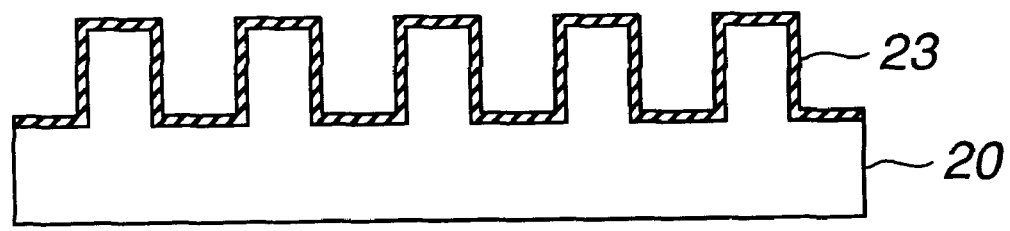
FIG. 13 is a diagram of another example structure for a forming plate for manufacturing thin film piezoelectric elements.

A first removal method is described first. As diagrammed in FIG. 13, the pressure chamber plate 10 and a removal layer 23 made of a material exhibiting low adhesive force are formed on the surface of the forming plate 20, and the pressure chamber plate 10 is transfer-formed on this removal layer 23. Because the removal layer 23 exhibits but weak adhesiveness with the pressure chamber plate 10, removal is easy. The material for the removal layer may be selected as suitable according to the material of the forming plate 20 and the pressure chamber plate 10.

Figure 14:
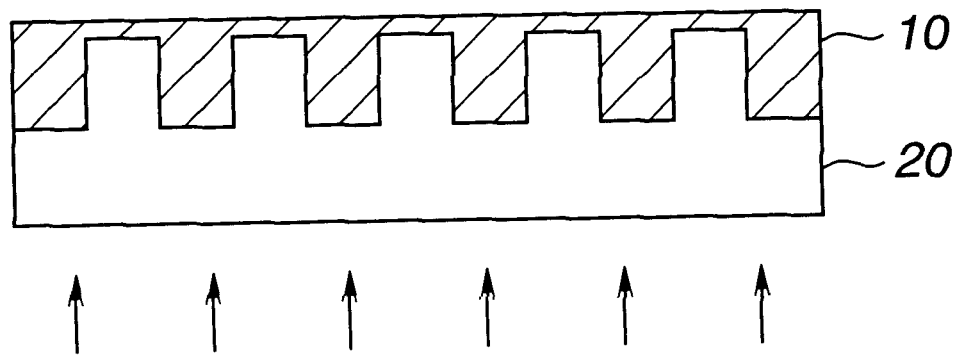
FIG. 14 is an explanatory diagram of a step for removing a pressure chamber plate from the forming plate.

A second removal method is described next. As diagrammed in FIG. 14, prior to removing the pressure chamber plate 10 from the forming plate 20, the interface between the forming plate 20 and the pressure chamber plate 10 is subjected to radiation to reduce the adhesive force between them. When this method is employed, a phenomenon such as ablation occurs at the interface between the two layers, whereby the various bonding forces between atoms and between molecules can be reduced or eliminated. Also, in some cases, the irradiation causes gas to be released from the pressure chamber plate 10, so that a separating effect is exhibited.

For the radiation, excimer laser light, for example, is preferable. Apparatuses are in practical use which output high-energy excimer laser light of short wavelength, permitting steping in extremely short times. That being so, ablation is induced only in the vicinity of the interface, so that the forming plate 10 and pressure chamber plate 10 are almost entirely unaffected. However, this radiation is not limited to excimer laser light, and various other kinds of radiation can be used so long as they exhibit a surface separating effect.

The forming plate 20 used must transmit the radiation used. It is desirable that the radiation transmissivity be 10% or greater, and preferably 50% or greater. If the radiation transmissivity is too low, the radiation absorption rate will become large, making it impossible to obtain the quantity of radiation needed for the ablation phenomenon, etc. In view of this point, quartz glass is an ideal material for the forming plate 20 because its excimer laser light transmissivity is high, and because it exhibits outstanding mechanical strength and heat resistance.

Figure 15:
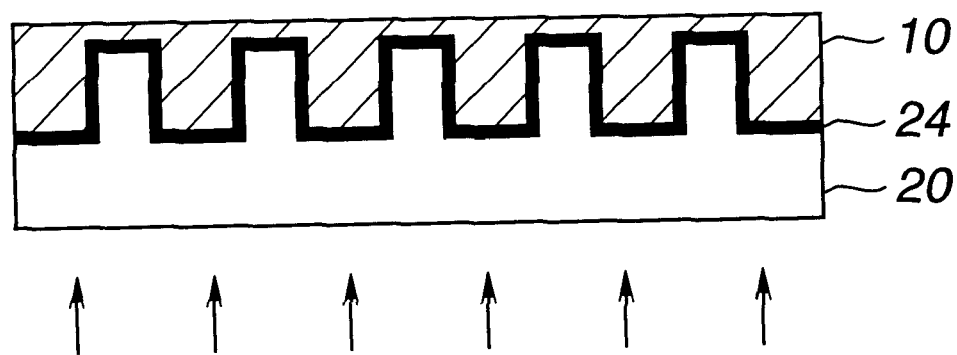
FIG. 15 is an explanatory diagram of a step for removing a pressure chamber plate from the forming plate.
Figure 16:
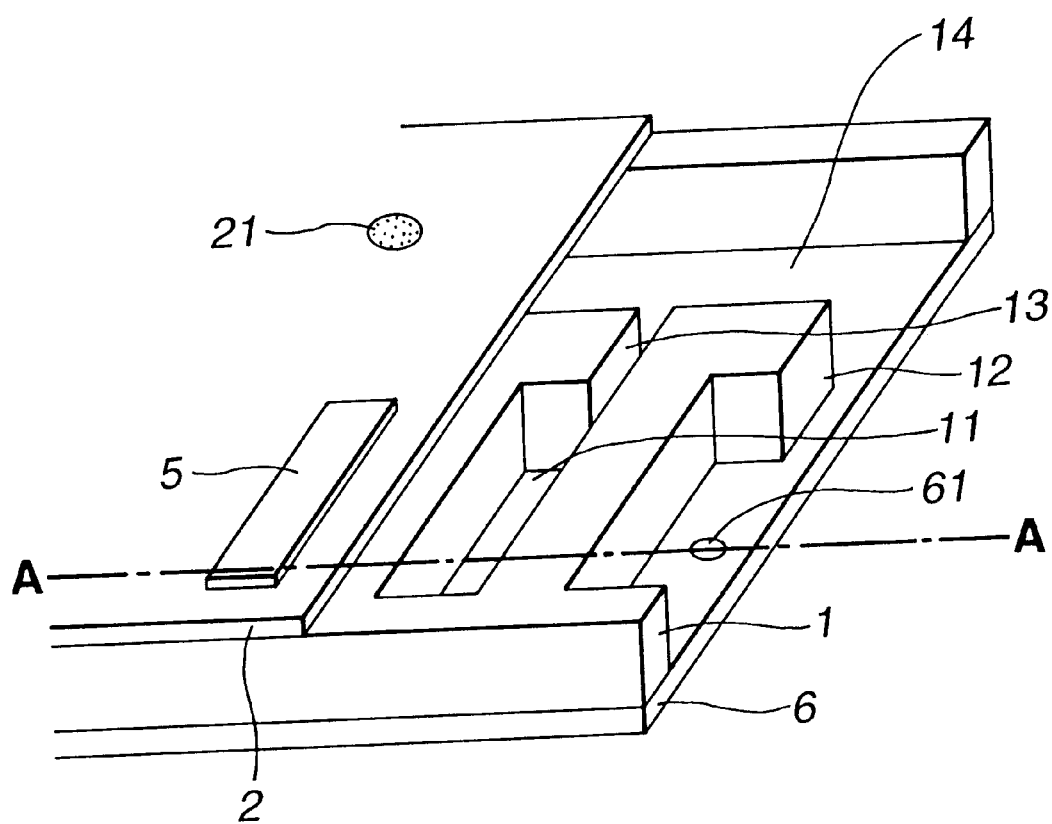
FIG. 16 is a partially cut-away diagonal view of the structure of an ink jet recording head.

Lastly, a third removal method is described. As diagrammed in FIG. 15, a separation layer 24 is formed that produces separation at the interface between the forming plate 20 and the pressure chamber plate 20 when irradiated. The forming plate 20 and the pressure chamber plate 10 can be separated by inducing ablation separation in the separation layer 24 without affecting the forming plate 20 or the pressure chamber plate 10.

For the separation layer 24, various types of oxide ceramics can be used such as amorphous silicon, silicon oxide, silicates, titanium oxide, titanates, zirconium oxide, zirconates, lanthanum oxide, and lanthanates, etc. Also usable are such nitride ceramics as silicon nitride, aluminum nitride, and titanium nitride, etc., and such organic polymer materials as acrylic resins, epoxy resins, polyamides, and polyimides, etc. It is also possible to use alloys including one or more metals selected from among aluminum, lithium, titanium, manganese, indium, tin, yttrium, lanthanum, cerium, neodymium, praseodymium, and samarium. These materials may be suitably selected according to the step conditions and forming plate 20 material, etc.

The method used for forming the film for the separation layer 24 may be any of various vapor phase growing methods such as CVD, evaporation, sputtering, and ion plating, etc., or electroplating, non-electrolytic plating, the Langmuir-Blodgett method, spin coating, spray coating, roller coating, or bar coating, etc.

The thickness of the separation layer 24 will differ depending on the composition of the separation layer 24, but ordinarily a thickness of 1 nm to 20 $\mu$m is desirable, with a range of 10 nm to 20 $\mu$m being preferable, and a range of 40 nm to 1 $\mu$m being particularly preferable. If the thickness of the separation layer is too thin, damage to the pressure chamber plate 10 will increase, whereas if the thickness is too great, the quantity of radiation needed for separation will become excessive. It is also desirable that the film thickness of the separation layer 24 be as uniform as possible.

As based on this embodiment aspect, as described in the foregoing, in addition to the thin film piezoelectric elements, the pressure chamber plate can also be transfer-formed with a forming plate whereon is formed the prescribed convex-concave pattern, wherefore the cost of manufacturing the ink jet recording head can be reduced. That is, once the forming plate has been fabricated, it can be used repeatedly to the extent that its durability allows, wherefore forming plate fabrication can be omitted from the ink jet recording head manufacturing step from the second step on.

Furthermore, manufacturing equipment space savings can be realized by reducing the number of lithographic steps, and the cost of materials needed in the lithographic steps can also be reduced.

In terms of industrial applicability, by using the present invention it is possible to manufacture thin film piezoelectric elements and ink jet recording heads with a simple method involving fewer lithographic steps. As a consequence, manufacturing costs can be lowered, and ink jet recording heads provided at low cost.

What is claimed is:

1. A thin film piezoelectric element manufacturing method comprising:

a step of forming thin film piezoelectric elements by a transfer process with a forming plate whereon are formed concavities matching a shape of said thin film piezoelectric elements.

2. The thin film piezoelectric elements manufacturing method according to claim 1, comprising steps of sequentially laminating first electrodes and a piezoelectric film inside said concavities, film-forming a second electrode on said piezoelectric film and forming said thin film piezoelectric elements, and removing said thin film piezoelectric elements from said concavities.

3. The thin film piezoelectric elements manufacturing method according to claim 1, wherein said thin film piezoelectric elements are transfer-formed with a forming plate wherein openings of said concavities are made larger than bottoms thereof, and wide walls thereof exhibit a tapered shape.

4. A manufacturing method for forming plates for fabricating thin film piezoelectric elements, being a method for manufacturing any of forming plates cited in claim 1 comprising:

a step for patterning a resist layer coated on a forming plate mother material so as to match shape of said thin film piezoelectric elements;

a step for etching said forming plate mother material using said patterned resist layer as a mask; and a step for forming concavities matching shapes of said thin film piezoelectric elements.

5. The manufacturing method for forming plates for fabricating thin film piezoelectric elements according to claim 4, wherein openings of said concavities are made larger than bottoms thereof, and side walls thereof exhibit a tapered shape.

6. The manufacturing method for forming plates for fabricating thin film piezoelectric elements according to claim 4, wherein said forming plate mother material is silicon or quartz.

7. A manufacturing method for an ink jet recording head wherein thin film piezoelectric elements functioning as ejection drive sources for a fluid loaded in pressure chambers formed in a pressure chamber plate are provided in said pressure chamber plate, comprising:

a step for transfer-forming said thin film piezoelectric elements in said pressure chamber plate with a forming plate wherein are formed concavities matching a shape of said thin film piezoelectric elements.

8. The manufacturing method for an ink jet recording head according to claim 7, comprising steps of sequentially laminating first electrodes and a piezoelectric film inside said concavities, film-forming a second electrode on said piezoelectric film and forming said thin film piezoelectric elements, and removing said thin film piezoelectric elements from said concavities and transferring them to said pressure chamber plate.

9. The manufacturing method for an ink jet recording head according to claim 8, wherein openings of said concavities are made larger than bottoms thereof, and side walls thereof exhibit a tapered shape.

10. The manufacturing method for an ink jet recording head according to claim 7, wherein, in fabricating said pressure chamber plate, said pressure chambers are transfer-formed with a second forming plate wherein are formed concavities matching shapes of said pressure chambers.

11. A manufacturing method for forming plates for fabricating thin film piezoelectric elements, being a method for manufacturing any of forming plates cited in claim 7, comprising:

a step for pattering a resist layer coated on a forming plate mother material so as to match a shape of said thin film piezoelectric elements;

a step for etching said forming plate mother material using said patterned resist layer as a mask; and a step for forming concavities matching shapes of said thin film piezoelectric elements.

12. A forming plate for fabricating thin film piezoelectric elements, comprising:

concavities patterned to match shape of said thin film piezoelectric elements.

13. The forming plate for fabricating thin film piezoelectric elements according to claim 12, wherein said concavities are formed with an alignment pitch of 70.5 µm.

14. The forming plate for fabricating thin film piezoelectric elements according to claim 12, wherein said concavities are arrayed in a plurality of rows, and an interval between said rows is 141 µm.

* * * * *